(12) United States Patent
Greenlee et al.

(10) Patent No.: US 11,404,436 B2
(45) Date of Patent: *Aug. 2, 2022

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Jordan D. Greenlee, Boise, ID (US); John D. Hopkins, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

This patent is subject to a terminal disclaimer.

(21) Appl. No.: 16/891,297

(22) Filed: Jun. 3, 2020

(65) Prior Publication Data

US 2021/0384216 A1 Dec. 9, 2021

(51) Int. Cl.
*H01L 27/11582* (2017.01)
*H01L 27/11524* (2017.01)
(Continued)

(52) U.S. Cl.
CPC .. *H01L 27/11582* (2013.01); *H01L 21/32155* (2013.01); *H01L 27/1157* (2013.01);
(Continued)

(58) Field of Classification Search
CPC .............. H01L 27/11582; H01L 27/11578
See application file for complete search history.

(56) References Cited

U.S. PATENT DOCUMENTS

2017/0092654 A1 3/2017 Nishikawa et al.
2017/0287926 A1 10/2017 Ariyoshi
(Continued)

FOREIGN PATENT DOCUMENTS

WO  WO  8/2021
PCT/US2021/032189

OTHER PUBLICATIONS

Sievila, et al., "The fabrication of silicon nanostructures by focused-ion-beam implantation and TMAH wet etching", Nanotechnology vol. 21, Mar. 10, 2010, United Kingdom, pp. 1-6.

*Primary Examiner* — Christopher A Johnson
(74) *Attorney, Agent, or Firm* — Wells St. John P.S.

(57) ABSTRACT

A method used in forming a memory array comprising strings of memory cells comprises forming a conductor tier comprising conductor material on a substrate. Laterally-spaced memory-block regions are formed and individually comprise a vertical stack comprising alternating first tiers and second tiers directly above the conductor tier. Channel-material strings of memory cells extend through the first tiers and the second tiers. Horizontally-elongated lines are formed in the conductor material between the laterally-spaced memory-block regions. The horizontally-elongated lines are of different composition from an upper portion of the conductor material that is laterally-between the horizontally-elongated lines. After the horizontally-elongated lines are formed, conductive material of a lowest of the first tiers is formed that directly electrically couples together the channel material of individual of the channel-material strings and the conductor material of the conductor tier. Other embodiments, including structure independent of method, are disclosed.

11 Claims, 11 Drawing Sheets

(51) Int. Cl.
*H01L 27/11556* (2017.01)
*H01L 21/3215* (2006.01)
*H01L 27/1157* (2017.01)
*H01L 27/11565* (2017.01)
*H01L 27/11519* (2017.01)

(52) U.S. Cl.
CPC .. *H01L 27/11519* (2013.01); *H01L 27/11524* (2013.01); *H01L 27/11556* (2013.01); *H01L 27/11565* (2013.01)

(56) References Cited

U.S. PATENT DOCUMENTS

| | | |
|---|---|---|
| 2018/0261671 A1 | 9/2018 | Matsumoto et al. |
| 2019/0157294 A1 | 5/2019 | Kanamori et al. |
| 2020/0051997 A1 | 2/2020 | Park |

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-25 which may be considered as a "gate-last" or "replacement-gate" process, and starting with FIGS. 1 and 2.

Figure 1:
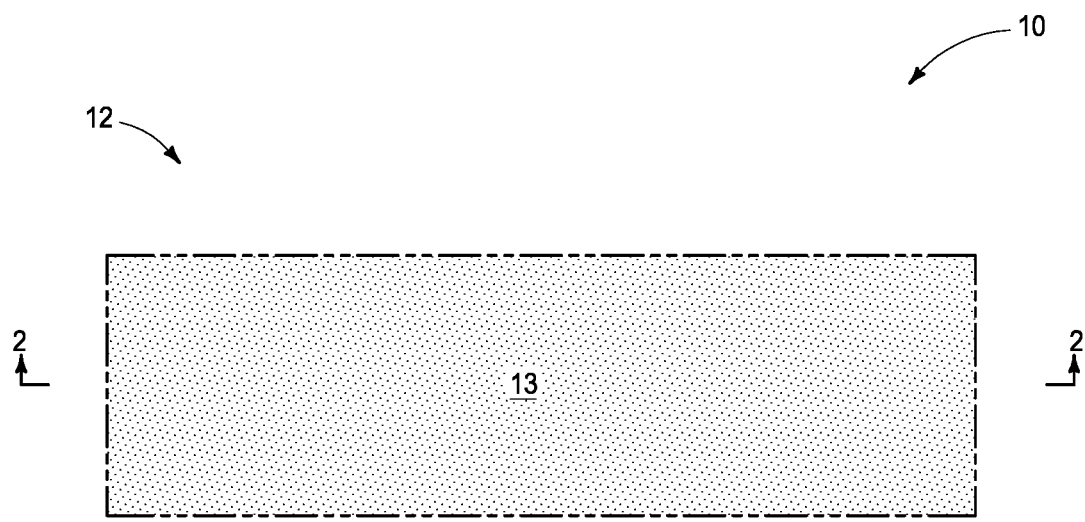
FIG. 1 is a diagrammatic cross-sectional view of a portion of a substrate in process in accordance with an embodiment of the invention and is taken through line 1-1 in FIG. 2.
Figure 2:
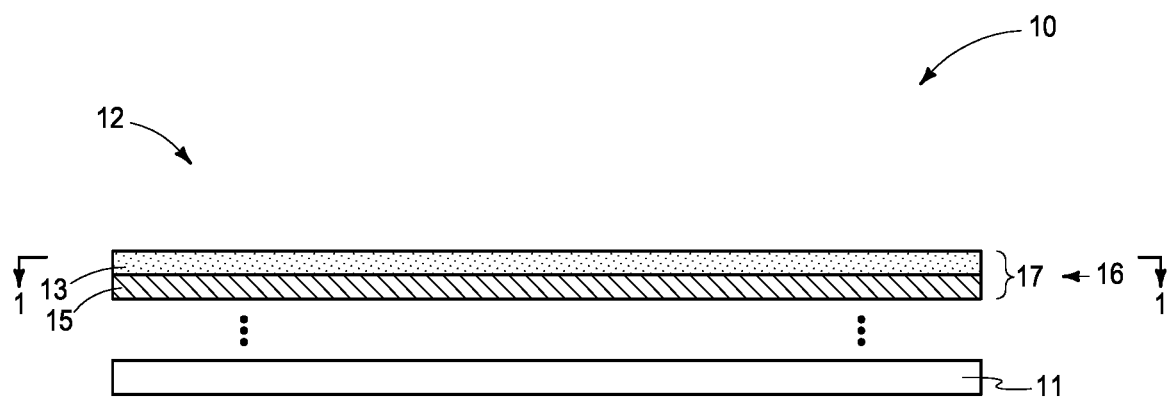
FIG. 2 is a diagrammatic cross-sectional view taken through line 2-2 in FIG. 1.

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. In one embodiment, conductor material 17 comprises conductively-doped semiconductive material 13 (e.g., n-type conductively-doped polysilicon) atop (directly above, and e.g., directly against) metal material 15 (e.g., $WSi_x$). Conductor tier 16 may comprise part of control circuitry (e.g., peripheral-under-array circuitry and/or a common source line or plate) used to control read and write access to the transistors and/or memory cells that will be formed within array 12.

Figure 3:
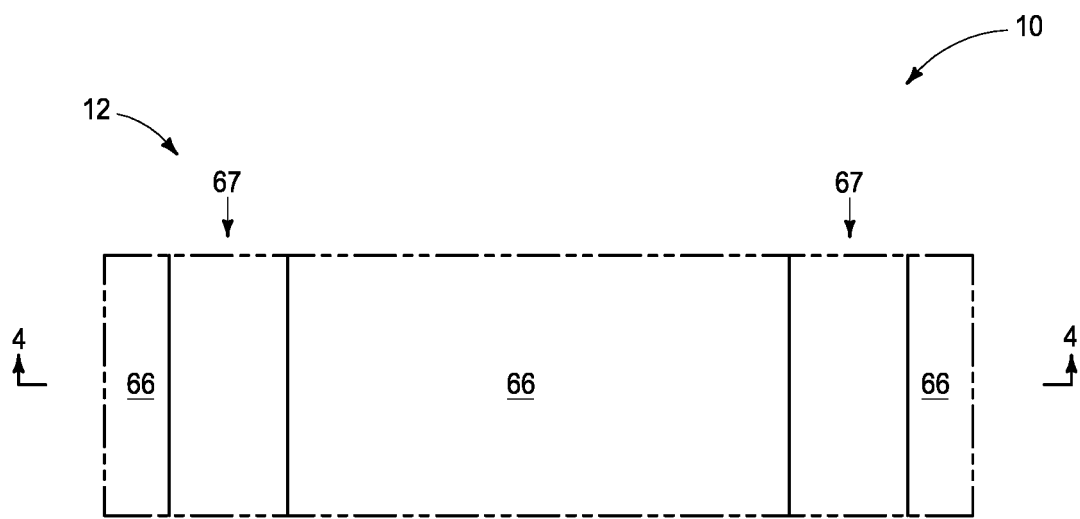
FIGS. 3-25 are diagrammatic sequential sectional, expanded, enlarged, and/or partial views of the construction of FIGS. 1 and 2, or portions thereof, in process in accordance with some embodiments of the invention.
Figure 4:
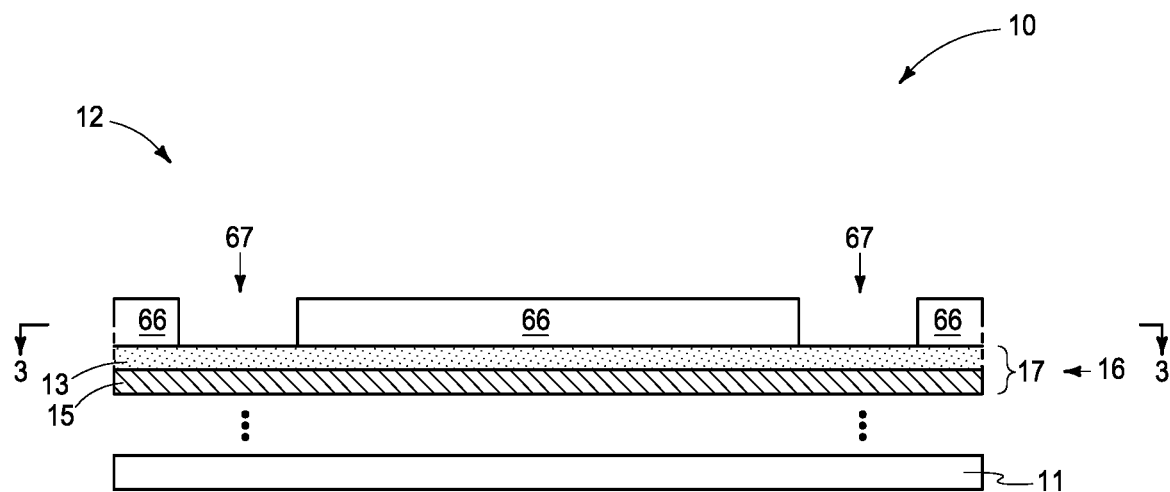

Referring to FIGS. 3 and 4, and in one embodiment, patterned masking material 66 having mask openings 67 has been formed atop conductor tier 16.

Figure 5:
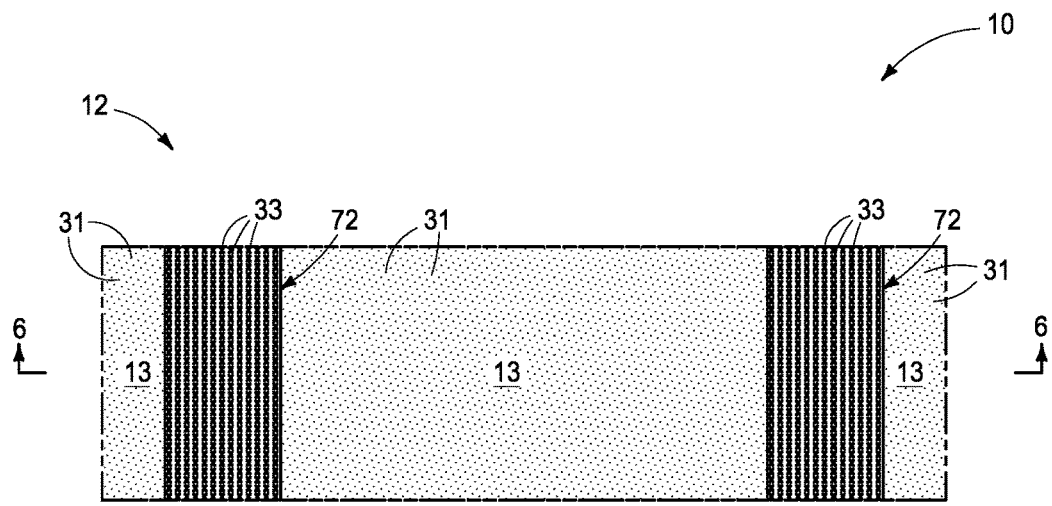
Figure 6:
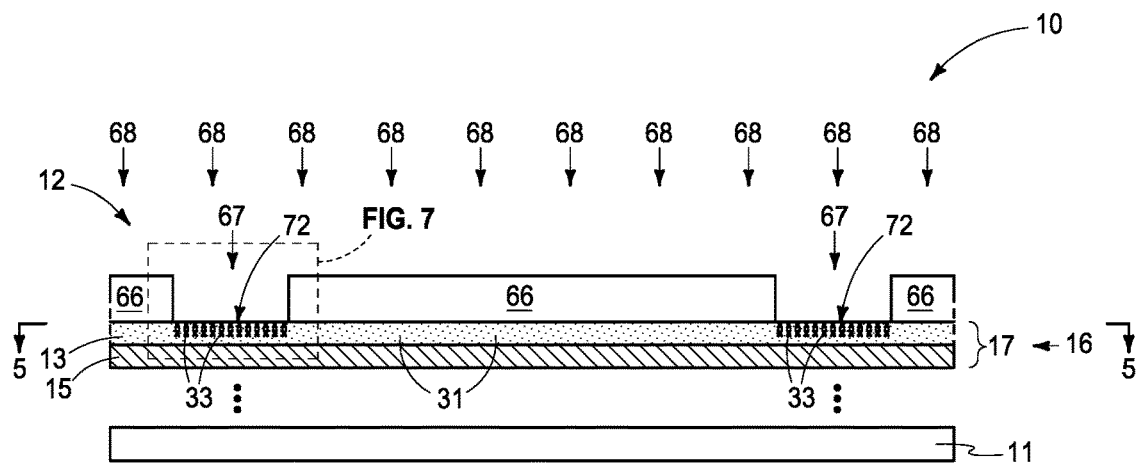
Figure 7:
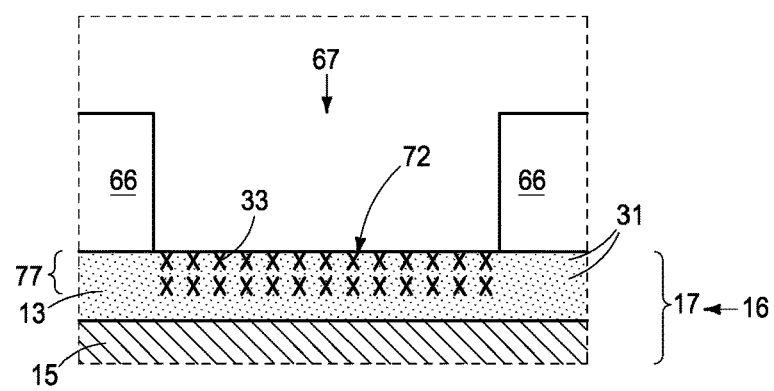
Figure 8:
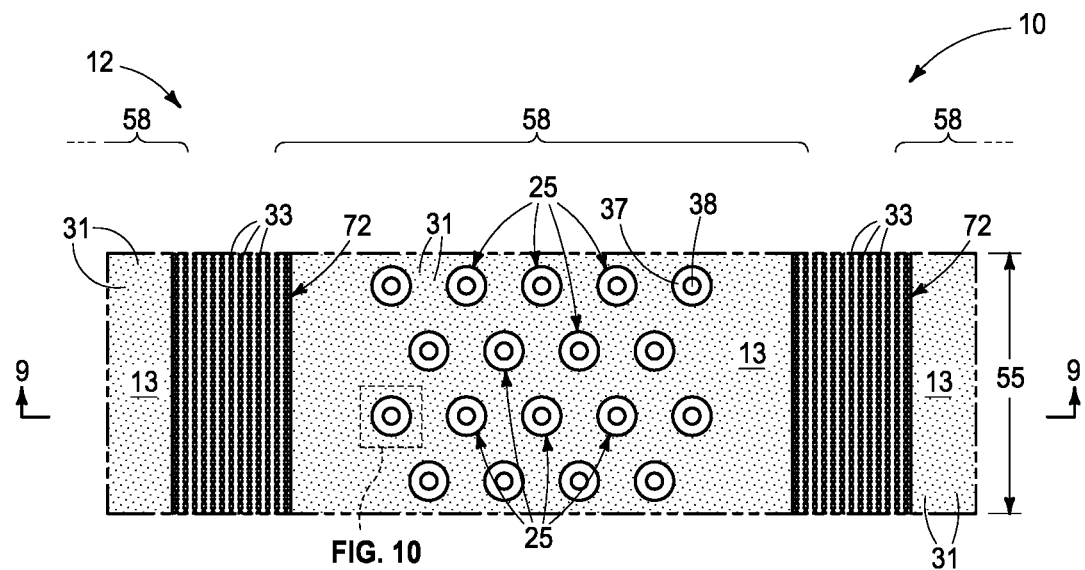
Figure 9:
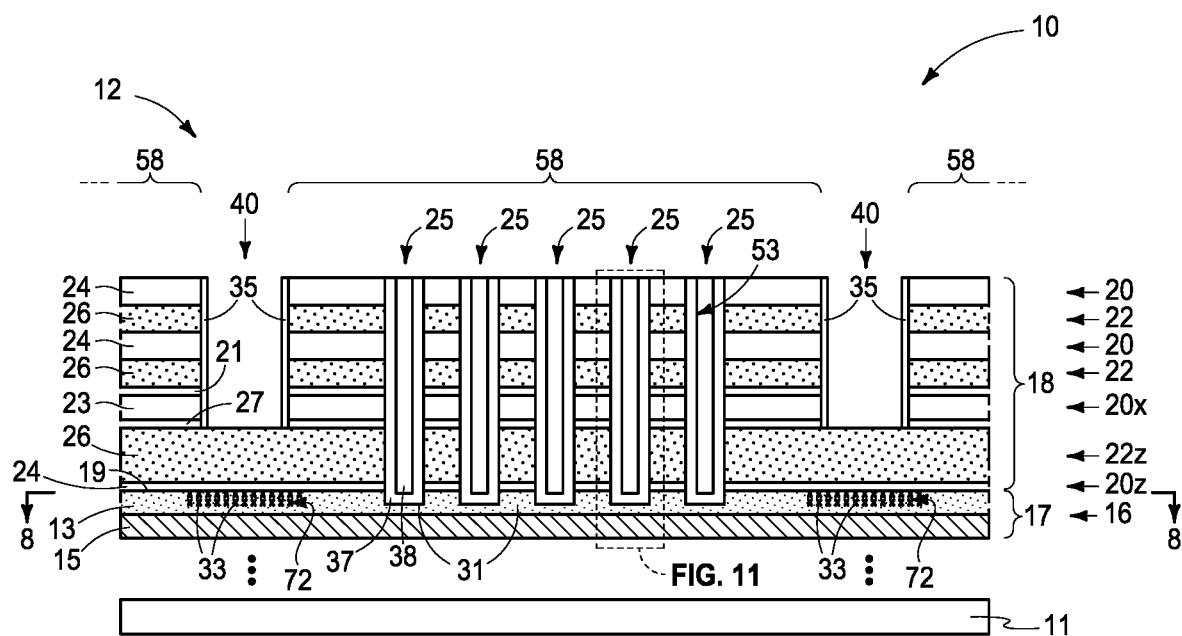
Figure 10:
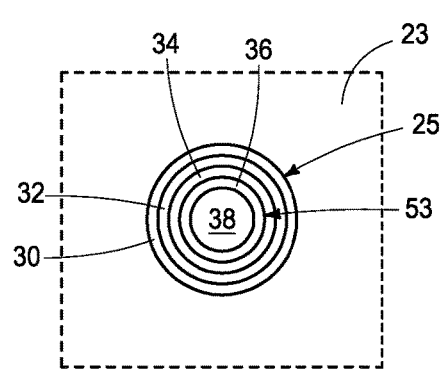
Figure 11:
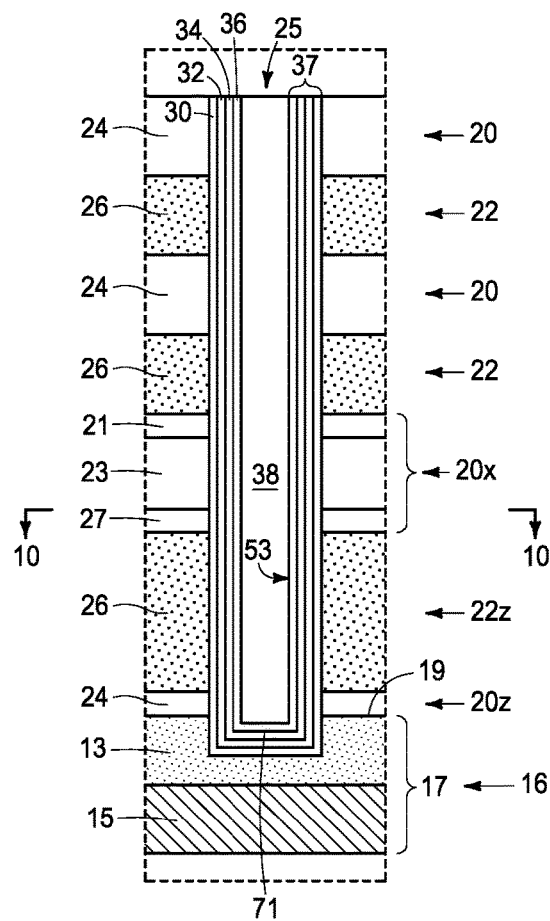

Referring to FIGS. 5-7, construction 10 has then been ion implanted (indicated by downwardly-directed arrows 68 in FIG. 2) to form horizontally-elongated lines 72 in conductor material 17 between what will comprise laterally-spaced memory-block regions there-above (not-yet-shown). Horizontally-elongated lines 72 are of different composition from an upper portion (at least an upper portion) of conductor material 17 that is laterally-between horizontally-elongated lines 72. In one embodiment and as shown, horizontally-elongated lines 72 are not as vertically thick as conductor tier 16. In one embodiment, horizontally-elongated lines 72 have greater content of one or more of C, N, B, As, Sb, Bi, Li, Al, In, or metal material than is present (if any) in conductor material 17 that is laterally-between horizontally-elongated lines 72. In one embodiment, horizontally-elongated lines 72 are not conductive (i.e., they are insulative or semiconductive), and in another embodiment are conductive.

In one embodiment, an uppermost portion 77 (at least an uppermost portion) of horizontally-elongated lines 72 comprises conductively-doped semiconductive material (e.g., conductively-doped polysilicon) having one of a primary n-type or p-type conductivity-producing dopant therein (e.g., 31). The primary n-type dopant or the primary p-type dopant in this context is what renders what would be an otherwise semiconductive material to be conductive as a result of concentration of such primary dopant type. At least the uppermost portion of horizontally-elongated lines 72 comprise a secondary dopant (e.g., 33) of different composition from that of the primary dopant. In one embodiment, the one is the primary n-type conductivity-producing dopant, and in one embodiment the one is the primary p-type conductivity-producing dopant. In one embodiment, the different primary and secondary dopants are the same n or p type, and in another embodiment are of different n or p type. In one embodiment, the secondary dopant is one or more of C, N, B, As, or metal material. In one embodiment, the secondary dopant is one or more of Sb, Bi, Li, Al, or In. In one embodiment, the secondary dopant in the uppermost portion of the horizontally-elongated lines is at a concentration of at least $1 \times 10^{14}$ atoms/cm$^3$ in the uppermost portion. In one embodiment, such comprises multiple different composition secondary dopants.

The above processing is but one example of forming horizontally-elongated lines 72 and to have one or more of the above example attributes. Any alternate existing or future-developed manners and attributes may be used or result. For example, and by way of example only, masking material 66 with openings 67 therein may be used as an etch mask while conducting a timed etch into conductor material 17 to form trenches therein (not shown). Such trenches could be filled with material of different composition from that of material 13 and then such material being planarized back at least to the top surface of material 13 to form lines 72.

Referring to FIGS. 8-11, a stack 18 comprising vertically-alternating insulative tiers 20* and conductive tiers 22* has been formed above conductor tier 16 (an * being used as a suffix to be inclusive of all such same-numerically-designated components that may or may not have other suffixes). Example thickness for each of tiers 20* and 22* is 22 to 60 nanometers. Only a small number of tiers 20* and 22* is shown, with more likely stack 18 comprising dozens, a hundred or more, etc. of tiers 20* and 22*. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22* and/or above an uppermost of the conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier. Regardless, conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". Example conductive tiers 22* comprise first material 26 (e.g., silicon nitride) which may be wholly or partially sacrificial. Example insulative tiers 20* comprise second material 24 (e.g., silicon dioxide) that is of different composition from that of first material 26 and which may be wholly or partially sacrificial. In embodiment, lowest first tier 22z comprises sacrificial material of different composition from that of an uppermost portion of horizontally-elongated lines 72 in conductor material 17.

In some embodiments, a lowest first tier 22z is thicker than the first tiers 22* there-above and in one such embodiment is at least 1.5 times thicker than first tiers 22* there-above. In one embodiment and as shown, lowest first tier 22z is not directly against conductor material 17 of conductor tier 16, for example where a lowest second tier 20z is vertically between conductor material 17 of the conductor tier 16 and lowest first tier 22z. Alternately, the lowest first tier may be directly against the conductor material of the conductor tier (not shown). In one embodiment, lowest second tier 20z is directly against a top 19 of conductor material 17 of conductor tier 16. In one embodiment, lowest second tier 20z is thinner than second tiers 20* there-above. In one embodiment, the second tier 20x that is immediately-above lowest first tier 22z (e.g., next-higher second tier 20x) is thicker than second tiers 20* there-above.

The second-tier material of second tier 20x that is immediately-above lowest first tier 22z (i.e., there being no other second tier vertically between lowest first tier 22z and said second tier 20x immediately-there-above) comprises an upper first insulative material 21 and a lower second material 23 under upper first insulative material 21, with lower second material 23 being of different composition from that of upper first insulative material 21. Upper insulative material 21 may be of the same composition as material 24. In some embodiments, the second-tier material of second tier 20x that is immediately-above lowest first tier 22z may be considered as comprising an upper insulative material 21, a lower material 27, and an intermediate material 23 vertically-between upper insulative material 21 and lower material 27, with intermediate material 23 being of different composition from that of lower material 27 and from that of upper insulative material 21 (lower material 27 being optional in some embodiments). Upper insulative material 21 and lower material 27 may be of the same thickness as one another or of different thicknesses. Lower second material 23 may be thinner (as shown) than each of upper first insulative material 21 and lower material 27 or may be thicker than each of upper first insulative material 21 and lower material 27 (not shown). Regardless, in some embodiments upper insulative material 21 and lower material 27 are of the same composition relative one another (e.g., and the same composition as material 24) and in other embodiments are of different composition relative one another. In some embodiments, lower second material 23/intermediate material 23 comprises at least one of conductively-doped polysilicon, polysilicon that is not conductively doped, carbon-doped polysilicon, silicon nitride, undoped silicon nitride, carbon-doped silicon nitride, and metal material.

Channel openings 25 have been formed (e.g., by etching) through insulative tiers 20* and conductive tiers 22* to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to into conductor material 17 of conductor tier 16 is to provide and anchoring effect to material that is within channel openings 25. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial.

Horizontally-elongated trenches 40 have been formed (e.g., by anisotropic etching) into stack 18 to form laterally-spaced memory-block regions 58. Horizontally-elongated trenches 40 are individually directly above individual horizontally-elongated lines 72. In one embodiment and as shown, horizontally-elongated lines 72 extend laterally into areas of memory blocks 58 that are there-above. Horizontally-elongated lines 72 may be formed before or after forming vertical stack 18, By way of example and for brevity only, channel openings 25 are shown as being arranged in groups or columns of staggered rows of four and five channel openings 25 per row and being arrayed in laterally-spaced memory-block regions 58 that will comprise laterally-spaced memory blocks 58 in a finished circuitry construction. In this document, "block" is generic to include "sub-block". Trenches 40 will typically be wider than channel openings 25 (e.g., 10 to 20 times wider, yet such wider degree not being shown for brevity). Memory-block regions 58 and resultant memory blocks 58 (not yet shown) may be considered as being longitudinally elongated and oriented, for example along a direction 55. Any alternate existing or future-developed arrangement and construction may be used. Trenches 40 may have respective bottoms that are directly against first material 26 (atop or within) of lowest first tier 22z.

Trenches 40 have been lined with a thin lining material 35 (e.g., doped or undoped polysilicon or metal material) that may be partly or wholly sacrificial and ideally is of a composition other than that of materials 24 and 26. Such may be conformally deposited and thereafter substantially removed from being over horizontal surfaces, for example by maskless anisotropic spacer-like etching thereof or by a short wet etch. Some aspects of the invention were at least partially motivated in overcoming problems associated with the removing of lining material 35 from the bottom of trenches 40. Specifically, such removal of lining material 35 may be conducted using an etching chemistry that may undesirably etch through materials 26 and 24 of tiers 22z and 20z, respectively, exposing conductor material 17 therebelow. Such etching chemistry may then also undesirably etch conductor material 17 that can ultimately lead to destruction of the circuitry being fabricated. Provision of horizontally-elongated lines 72 to be of a different and etch-resistant composition compared to material 13 laterally-there-adjacent can reduce or eliminate such undesired etching of such material 13 if exposed when etching material 35.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 8-11 show one embodiment wherein charge-blocking material 30, storage material 32, and charge-passage material 34 have been formed in individual channel openings 25 elevationally along insulative tiers 20* and conductive tiers 22*. Transistor materials 30, 32, and 34 (e.g., memory-cell materials) may be formed by, for example, deposition of respective thin layers thereof over stack 18 and within individual openings 25 followed by planarizing such back at least to a top surface of stack 18.

Channel material 36 has also been formed in channel openings 25 elevationally along insulative tiers 20* and conductive tiers 22*, thus comprising individual operative channel-material strings 53 in channel openings 25. Channel material 36 may be considered as having a lowest surface 71 thereof. Channel-material strings 53 in one embodiment have memory-cell materials (e.g., 30, 32, and 34) there-along and with second-tier material (e.g., 24) being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 12:
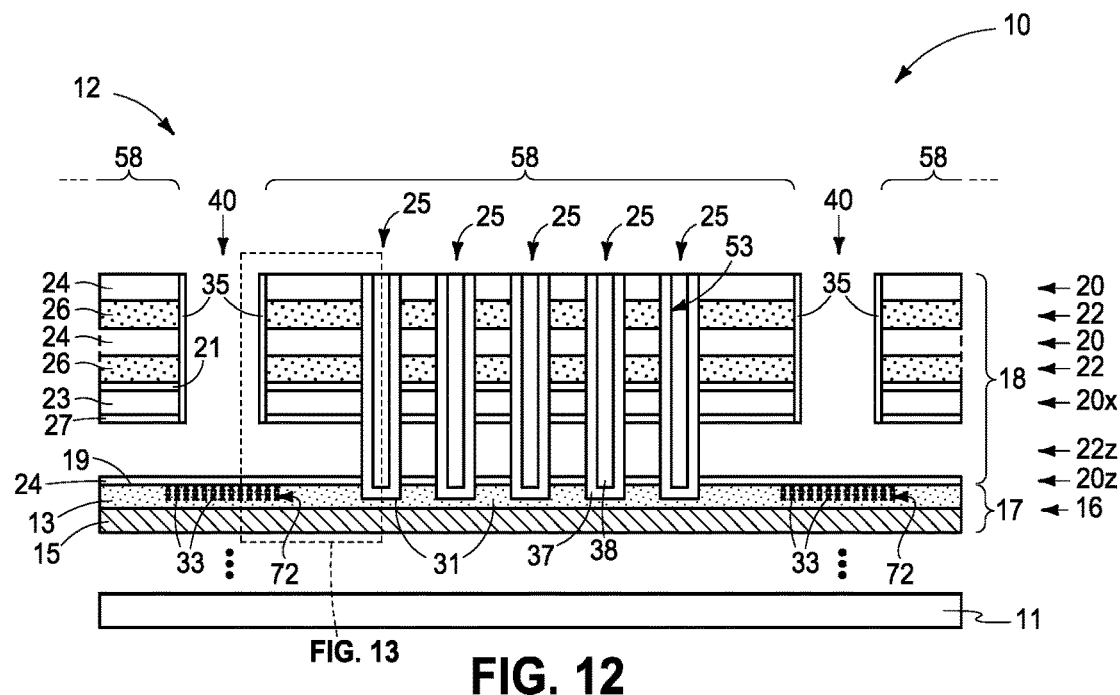
Figure 13:
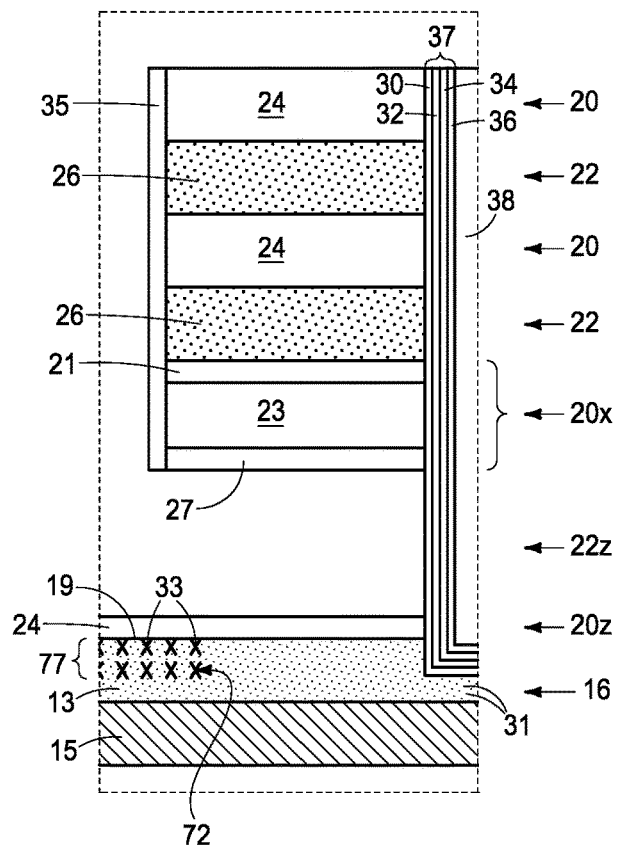

Referring to FIGS. 12 and 13, first-tier material 26 in lowest first tier 22z (not shown) has been isotropically etched selectively relative to second-tier material 24, lining material 35, and lower material 27 (e.g., using liquid or vapor $H_3PO_4$ as a primary etchant where material 26 is silicon nitride and exposed other materials comprise one or more oxides or polysilicon). If material 24 of lowest second tier 20z was previously etched through to conductor tier 16 (not shown) as identified in the problems stated above, horizontally-elongated lines 72 may eliminate or at least reduce etching of material of conductor tier 16.

Figure 14:
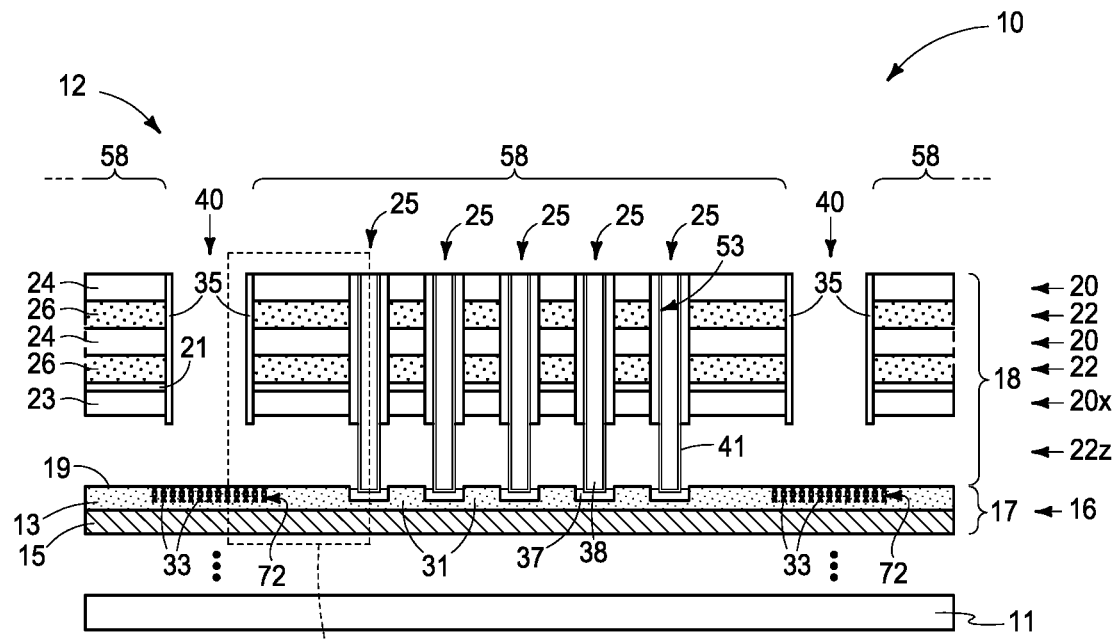
Figure 15:
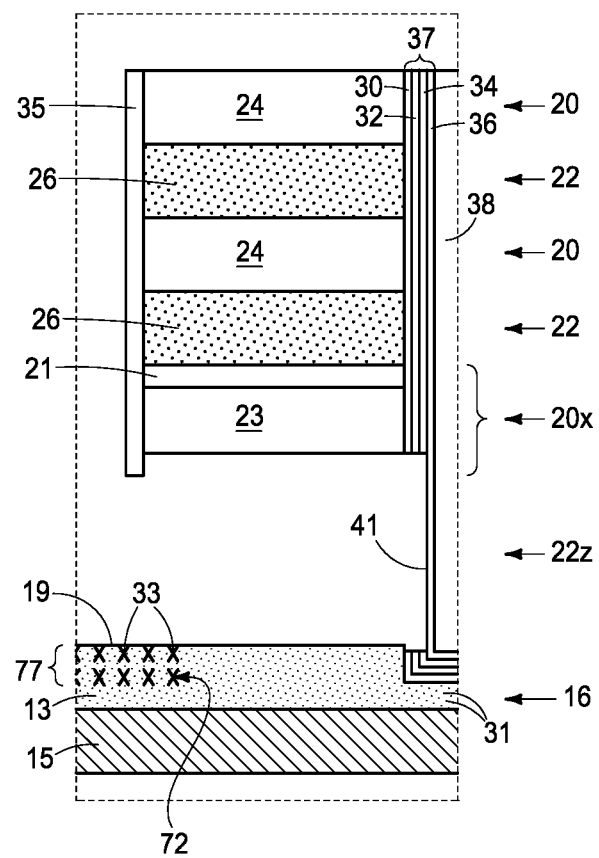

FIGS. 14 and 15 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched to expose a sidewall 41 of channel material 36 of channel-material strings 53. Regardless, and in one embodiment where lower material 27 is present as shown in FIGS. 12 and 13, lower material 27 (not shown in FIGS. 14 and 15) in second tier 20x that is immediately-above lowest first tier 22z has been etched selectively relative to and to expose a lower surface 31 of intermediate material 23. As an example, consider an embodiment where material 23 is polysilicon, materials 21, 24, and 27 are silicon dioxide, and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example construction shown by FIGS. 14 and 15. The artisan is capable of selecting other chemistries for etching other different materials where a construction as shown in FIGS. 14 and 15 is desired. Lower material 27 (not shown) is shown as having been removed in the processing of FIGS. 14 and 15 although such may not be removed until later in some embodiments. Material 24 of lowest second tier 20z as shown in FIGS. 12 and 13 has also been removed in FIGS. 14 and 15 (not shown).

Figure 16:
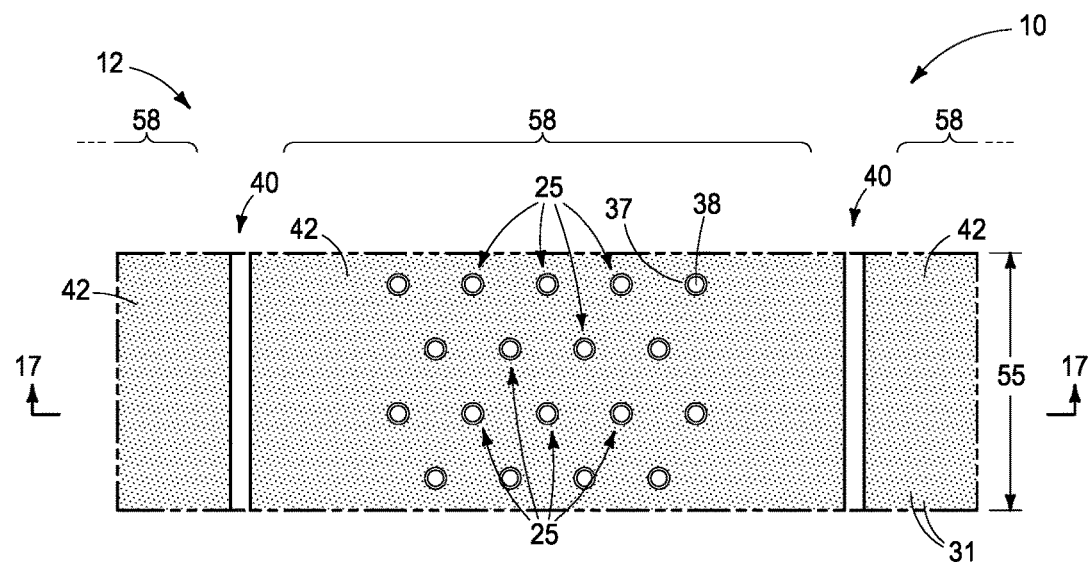
Figure 17:
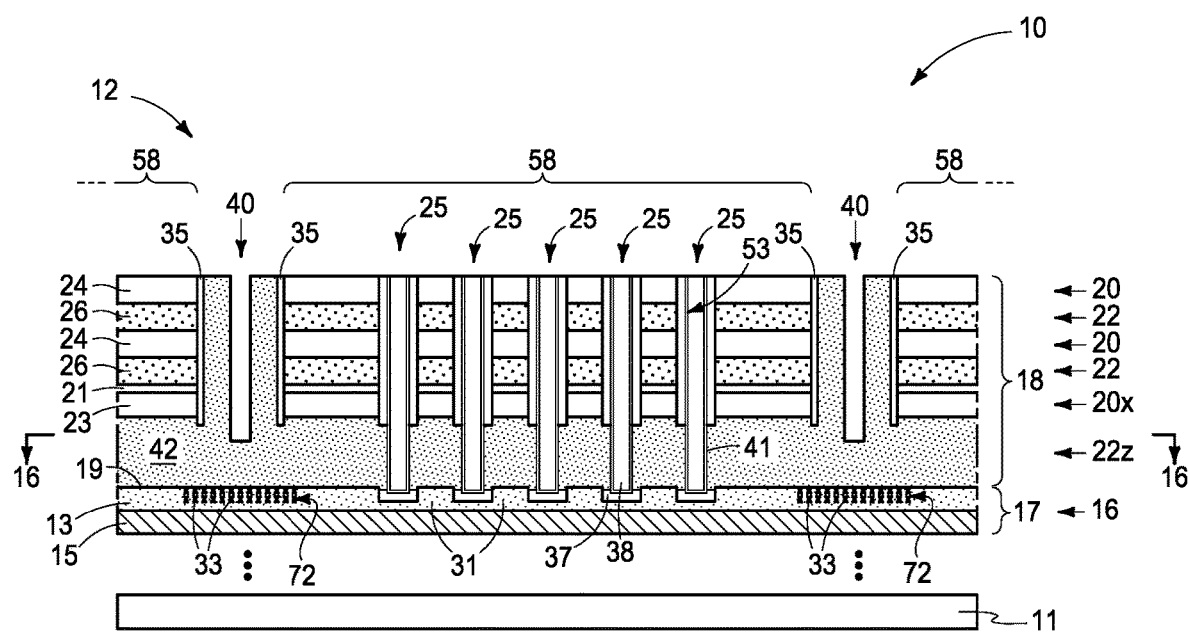

Referring to FIGS. 16 and 17, conductive material 42 has been formed in lowest first tier 22z to directly electrically couple together channel material 36 of individual of channel-material strings 53 and conductor material 17 of conductor tier 16. Example conductive materials include conductively-doped semiconductor material (e.g., conductively-doped polysilicon, such as comprising dopant 31 in sufficient quantity/concentration to render the polysilicon conductive) and metal material. In one embodiment, conductive material 42 in lowest first tier 22z is directly against sidewall 41 of channel material 36 of channel-material strings 53 and in one embodiment conductive material 42 in lowest first tier 22z is directly against an uppermost surface (e.g., 19) of the uppermost portion of conductor material 17 of conductor tier 16.

Figure 18:
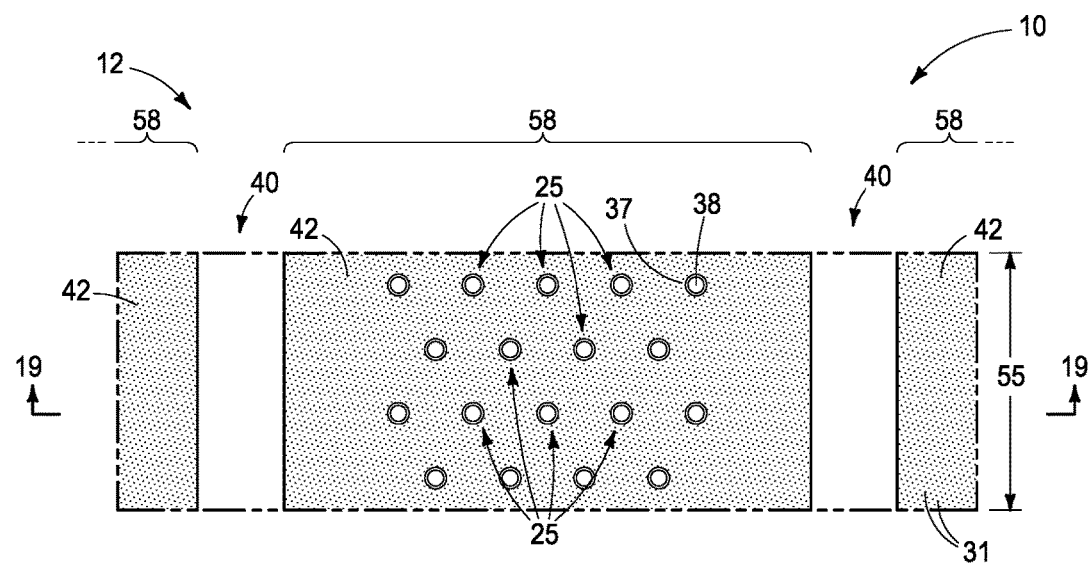
Figure 19:
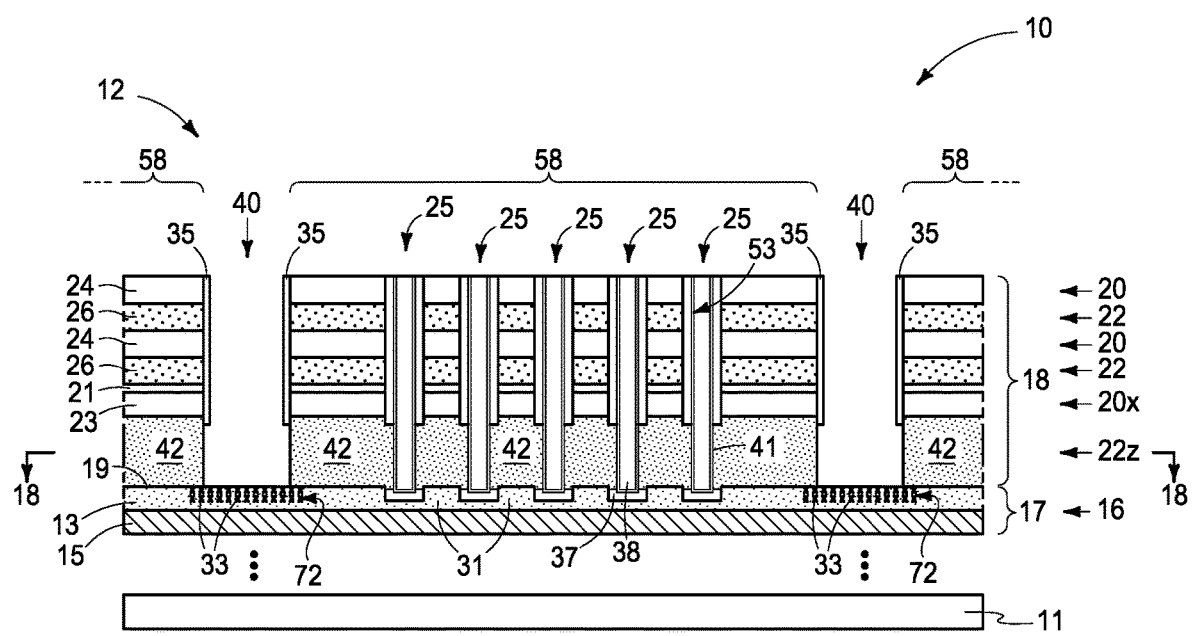
Figure 20:
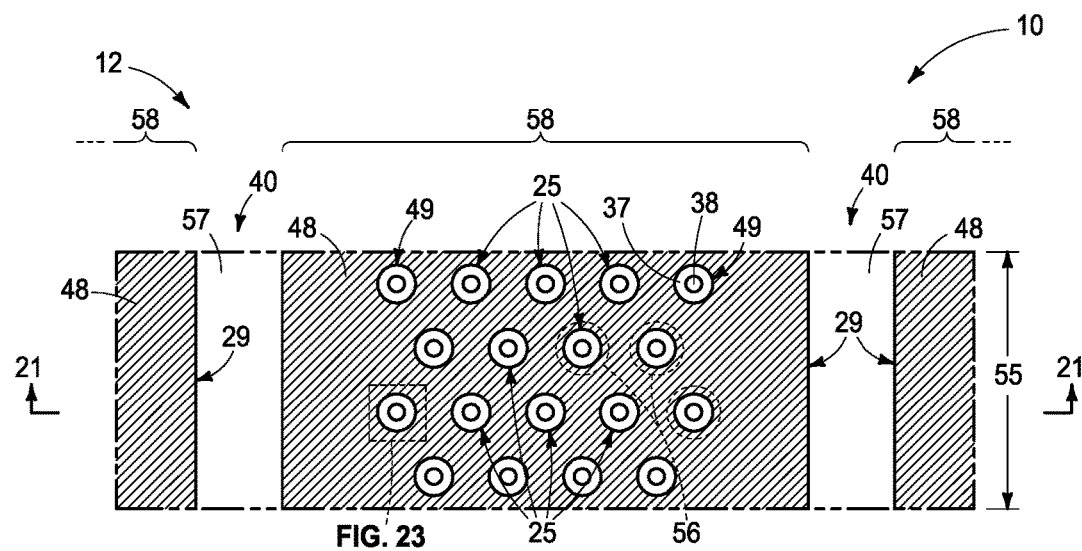
Figure 21:
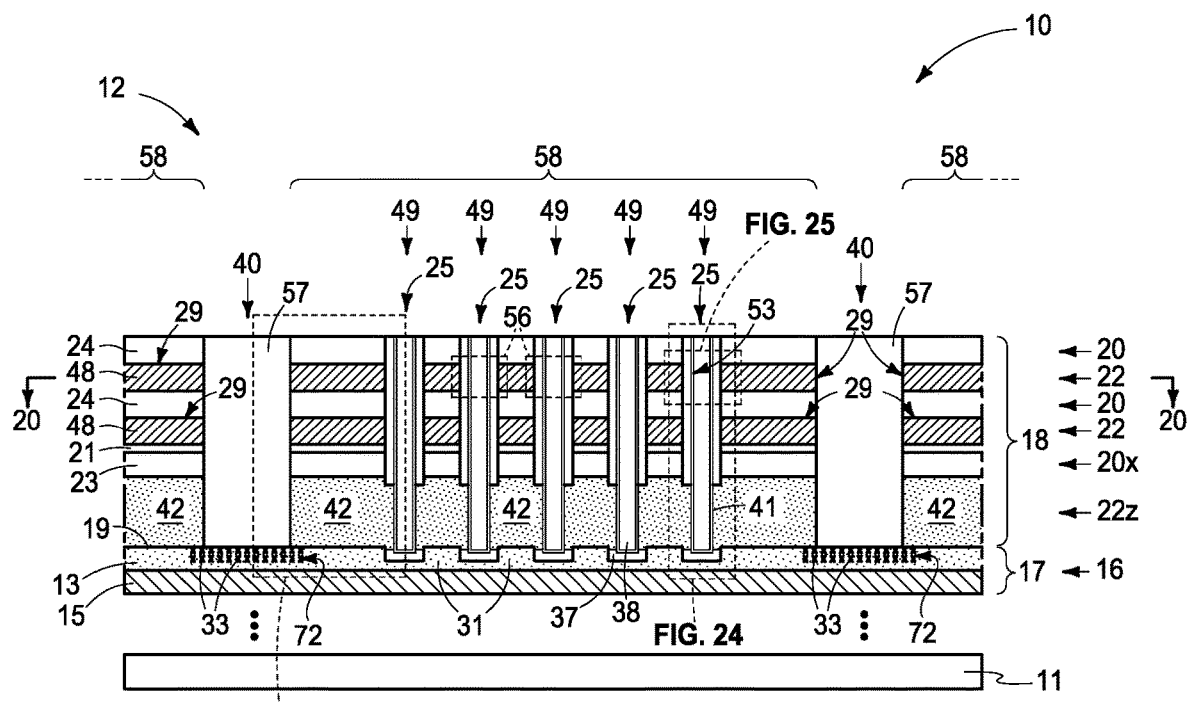
Figure 22:
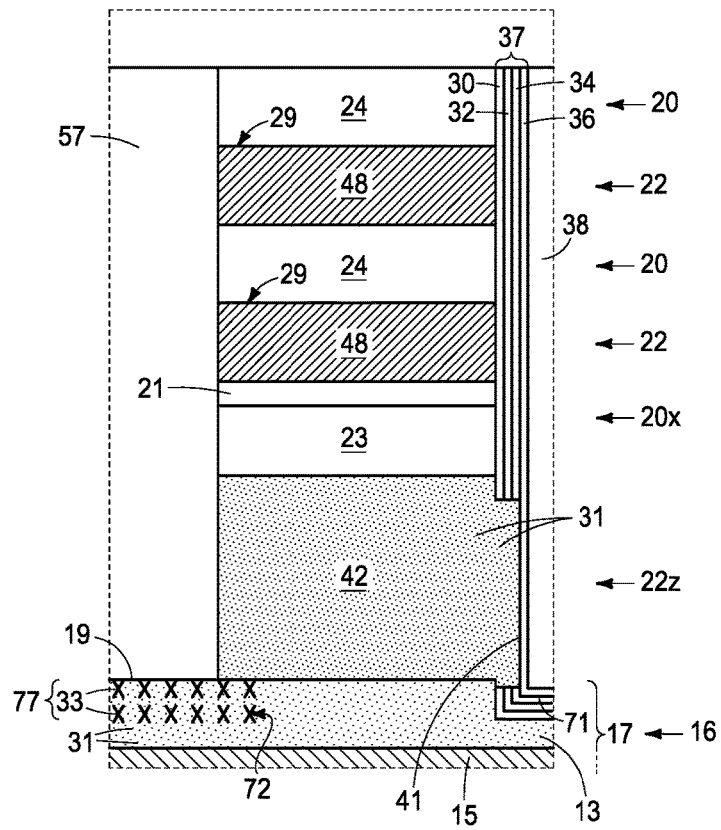
Figure 23:
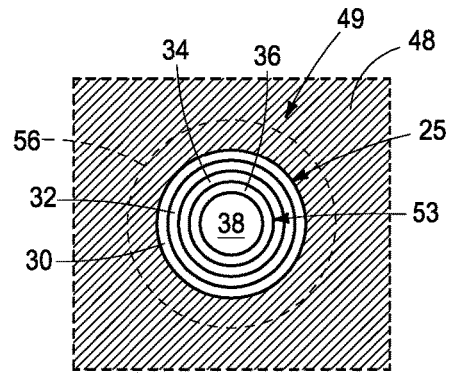
Figure 25:
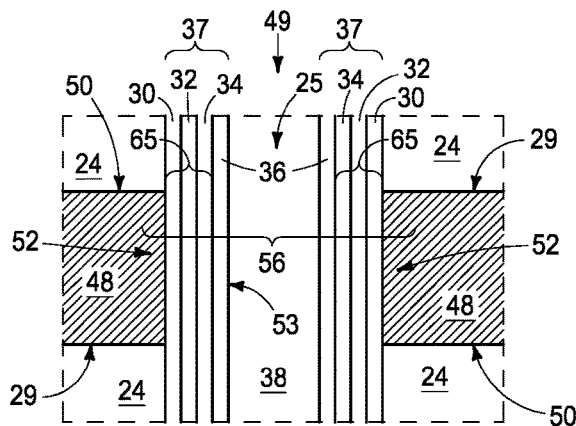
Figure 24:
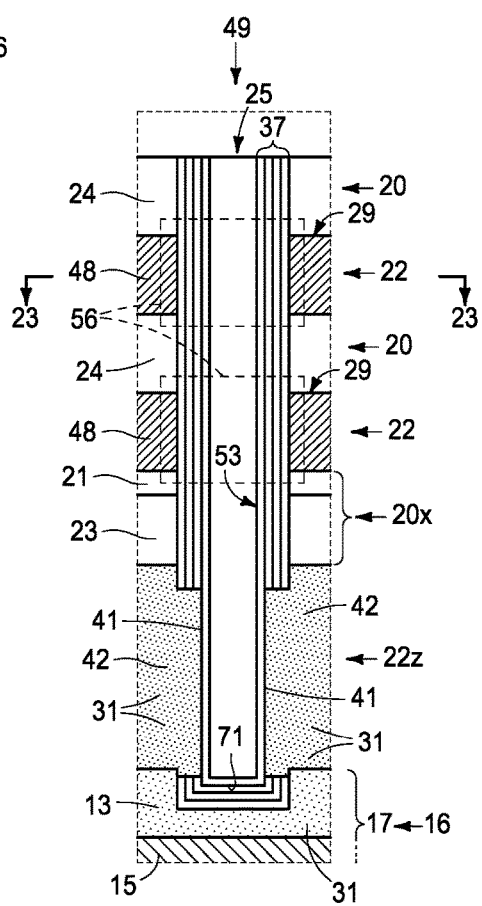

Referring to FIGS. 18 and 19, conductive material 42 has been removed from trenches 40, for example by anisotropic etching or by timed isotropic etching that may be conducted selectively relative to materials 35 and 13, and horizontally-elongated lines 72. The artisan is capable of selecting any suitable etching chemistry.

Referring to FIGS. 20-25, lining material 35 (not shown) has been removed. Thereafter, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of transistors and/or memory cells 56 are indicated with a bracket in FIG. 25 and some with dashed outlines in FIGS. 20, 21, 23, and 24, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 (FIG. 25) corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally-between control-gate region 52 and channel material 36. In one embodiment and as shown with respect to the example "gate-last" processing, conducting material 48 of conductive tiers 22 is formed after forming channel openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate.

Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In one embodiment and as shown, lowest surface 71 of channel material 36 of channel-material strings 53 is never directly against any of conductor material 17 of conductor tier 16.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22* from shorting relative one another in a finished circuitry construction. Example insulative materials are one or more of $SiO_2$, $Si_3N_4$, $Al_2O_3$, and undoped polysilicon. Intervening material 57 may include through array vias (not shown). Some material in trenches 40 formed prior to forming that which is designated as intervening material 57 may remain and thereby comprise part of the intervening material 57.

Any other attribute(s) or aspect(s) as shown and/or described herein with respect to other embodiments may be used in the embodiments shown and described with reference to the above embodiments.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). Laterally-spaced memory-block regions (e.g., 58) are formed that individually comprise a vertical stack (e.g., 18) comprising alternating first tiers (e.g., 22) and second tiers (e.g., 20) directly above the conductor tier. Channel-material strings (e.g., 53) of memory cells extend through the first tiers and the second tiers. Horizontally-elongated lines (e.g., 72) are formed in the conductor material between the laterally-spaced memory-block regions. The horizontally-elongated lines are of different composition from an upper portion (at least an upper portion; e.g., 77) of the conductor material that is laterally-between the horizontally-elongated lines. After forming the horizontally-elongated lines, conductive material (e.g., 42) of a lowest of the first tiers (e.g., 22z) is formed that directly electrically couples together the channel material of individual of the channel-material strings and the conductor material of the conductor tier. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises a conductor tier (e.g., 16) comprising conductor material (e.g., 17). The memory array comprises laterally-spaced memory blocks (e.g., 58) individually comprising a vertical stack (e.g., 18) comprising alternating insulative tiers (e.g., 20) and conductive tiers (e.g., 22). Channel-material strings (e.g., 53) of memory cells (e.g., 56) extend through the insulative tiers and the conductive tiers. Conducting material (e.g., 42) of a lowest of the conductive tiers (e.g., 22z) directly electrically couples together the channel material (e.g., 36) of individual of the channel-material strings and the conductor material in the conductor tier. Intervening material (e.g., 57) is laterally-between and longitudinally-along immediately-laterally-adjacent of the memory blocks. The intervening material comprises insulating material. Horizontally-elongated lines (e.g., 72) are in the conductor material between the laterally-spaced memory blocks. The horizontally-elongated lines are of different composition from the conductor material that is laterally-between the horizontally-elongated lines. Any other attribute(s) or aspect(s) as shown and/or described herein with respect to other embodiments may be used.

In one embodiment, a memory array (e.g., 12) comprising strings (e.g., 49) of memory cells (e.g., 56) comprises a conductor tier (e.g., 16) comprising n-type conductively-doped polysilicon (e.g., 13) having a primary n-type conductivity-producing dopant (e.g., 31) therein. The memory array comprises laterally-spaced memory blocks (e.g., 58) individually comprising a vertical stack (e.g., 18) comprising alternating insulative tiers (e.g., 20) and conductive tiers (e.g., 22) directly above the conductor tier. Channel-material strings (e.g., 53) of memory cells (e.g., 56) extend through the insulative tiers and the conductive tiers. A lowest of the conductive tiers (e.g., 22z) comprises n-type conductively-doped polysilicon directly against the n-type conductively-doped polysilicon of the conductor tier and directly against a sidewall (e.g., 41) of channel material (e.g., 36) of the channel-material strings in the lowest conductive tier. Intervening material (e.g., 57) is laterally-between and longitudinally-along immediately-laterally-adjacent of the memory blocks. The intervening material comprises insulating material. Horizontally-elongated lines (e.g., 72) are in the conductor material between the laterally-spaced memory blocks. The horizontally-elongated lines comprising n-type conductively-doped polysilicon comprising a secondary dopant (e.g., 33) of different composition from that of the primary dopant. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. Laterally-spaced memory-block regions are formed and individually comprise a vertical stack comprising alternating first tiers and second tiers directly above the conductor tier. Channel-material strings of memory cells extend through the first tiers and the second tiers. Horizontally-elongated lines are formed in the conductor material between the laterally-spaced memory-block regions. The horizontally-elongated lines are of different composition from an upper portion of the conductor material that is laterally-between the horizontally-elongated lines. After the horizontally-elongated lines are formed, conductive material of a lowest of the first tiers is formed that directly electrically couples together the channel material of individual of the channel-material strings and the conductor material of the conductor tier.

In some embodiments, a method used in forming a memory array comprising strings of memory cells comprises forming a conductor tier comprising conductor material on a substrate. Horizontally-elongated lines are formed in the conductor material between what will comprise laterally-spaced memory-block regions there-above. The horizontally-elongated lines are of different composition from an upper portion of the conductor material that is laterally-between the horizontally-elongated lines. After the horizontally-elongated lines are formed, a stack comprising vertically-alternating first tiers and second tiers is formed above the conductor tier. A lowest of the first tiers comprises sacrificial material of different composition from that of an uppermost portion of the horizontally-elongated lines in the conductor material. The stack comprises the laterally-spaced memory-block regions having horizontally-elongated trenches there-between that are individually directly above individual of the horizontally-elongated lines in the conductor material in the conductor tier. Channel-material strings extend through the first tiers and the second tiers. Material of the first tiers is of different composition from material of the second tiers. The sacrificial material is isotropically etched from the lowest first tier. After the isotropically etching, conductive material is formed in the lowest first tier that directly electrically couples together the channel material of individual of the channel-material strings and the conductor material of the conductor tier.

In some embodiments, a memory array comprising strings of memory cells comprises a conductor tier comprising conductor material. Laterally-spaced memory blocks individually comprise a vertical stack comprising alternating insulative tiers and conductive tiers directly above the conductor tier. Channel-material strings of memory cells extend through the insulative tiers and the conductive tiers. Conducting material of a lowest of the conductive tiers directly electrically couples together the channel material of individual of the channel-material strings and the conductor material of the conductor tier. Intervening material is laterally-between and longitudinally-along immediately-laterally-adjacent of the memory blocks. The intervening material comprises insulating material. Horizontally-elongated lines in the conductor material are between the laterally-spaced memory blocks. The horizontally-elongated lines are of different composition from the conductor material that is laterally-between the horizontally-elongated lines.

In some embodiments, a memory array comprising strings of memory cells comprises a conductor tier comprising n-type conductively-doped polysilicon that has a primary n-type conductivity-producing dopant therein. Laterally-spaced memory blocks individually comprise a vertical stack comprising alternating insulative tiers and conductive tiers directly above the conductor tier. Channel-material strings of memory cells extend through the insulative tiers and the conductive tiers. A lowest of the conductive tiers comprises n-type conductively-doped polysilicon directly against the n-type conductively-doped polysilicon of the conductor tier and directly against a sidewall of channel material of the channel-material strings in the lowest conductive tier. Intervening material is laterally-between and longitudinally-along immediately-laterally-adjacent of the memory blocks. The intervening material comprises insulating material. Horizontally-elongated lines in the conductor material are between the laterally-spaced memory blocks. The horizontally-elongated lines comprise n-type conductively-doped polysilicon comprising a secondary dopant of different composition from that of the primary dopant.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming a conductor tier comprising conductor material on a substrate;
   forming laterally-spaced memory-block regions individually comprising a vertical stack comprising alternating first tiers and second tiers directly above the conductor tier, channel-material strings of memory cells extending through the first tiers and the second tiers;
   forming horizontally-elongated lines in the conductor material between the laterally-spaced memory-block regions, the horizontally-elongated lines being of different composition from an upper portion of the conductor material that is laterally-between the horizontally-elongated lines; and after forming the horizontally-elongated lines, forming conductive material in a lowest of the first tiers that directly electrically couples together the channel material of individual of the channel-material strings and the conductor material of the conductor tier.

2. The method of claim 1 comprising forming the horizontally-elongated lines before forming the vertical stack.

3. The method of claim 1 comprising forming the horizontally-elongated lines after forming the vertical stack.

4. The method of claim 1 wherein the horizontally-elongated lines extend laterally into areas of the memory-block regions that are there-above.

5. The method of claim 1 wherein the horizontally-elongated lines are not as vertically thick as the conductor tier.

6. The method of claim 1 wherein the horizontally-elongated lines have greater content of one or more of C, N, B, As, Sb, Bi, Li, Al, In, or a metal material than is present in the conductor material that is laterally-between the horizontally-elongated lines.

7. The method of claim 1 wherein the horizontally-elongated lines are not conductive.

8. The method of claim 1 wherein the horizontally-elongated lines are conductive.

9. The method of claim 1 wherein the horizontally-elongated lines are formed by ion implanting into the conductor material through mask openings in a masking material.

10. The method of claim 1 wherein a lowest surface of the channel material of the channel-material-strings is never directly against any of the conductor material of the conductor tier.

11. A method used in forming a memory array comprising strings of memory cells, comprising:

forming a conductor tier comprising conductor material on a substrate;

forming horizontally-elongated lines in the conductor material between what will comprise laterally-spaced memory-block regions there-above, the horizontally-elongated lines being of different composition from an upper portion of the conductor material that is laterally-between the horizontally-elongated lines;

after forming the horizontally-elongated lines, forming a stack comprising vertically-alternating first tiers and second tiers above the conductor tier, a lowest of the first tiers comprising sacrificial material of different composition from that of an uppermost portion of the horizontally-elongated lines in the conductor material, the stack comprising the laterally-spaced memory-block regions having horizontally-elongated trenches there-between that are individually directly above individual of the horizontally-elongated lines in the conductor material in the conductor tier, channel-material strings extending through the first tiers and the second tiers, material of the first tiers being of different composition from material of the second tiers;

isotropically etching the sacrificial material from the lowest first tier; and after the isotropically etching, forming conductive material in the lowest first tier that directly electrically couples together the channel material of individual of the channel-material strings and the conductor material of the conductor tier.

* * * * *